United States Patent
Witmer et al.

(10) Patent No.: US 7,782,141 B2
(45) Date of Patent: Aug. 24, 2010

(54) ADAPTIVE SIGNAL-FEED-FORWARD CIRCUIT AND METHOD FOR REDUCING AMPLIFIER POWER WITHOUT SIGNAL DISTORTION

(75) Inventors: Steven B. Witmer, Sinking Springs, PA (US); Lunal Khuon, West Chester, PA (US); Brian K. Kullberg, Lake Oswego, OR (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/317,793

(22) Filed: Dec. 29, 2008

(65) Prior Publication Data

US 2010/0164630 A1    Jul. 1, 2010

(51) Int. Cl.
*H03F 3/04*    (2006.01)
(52) U.S. Cl. .................. 330/297; 330/149; 330/127
(58) Field of Classification Search ............... 330/297, 330/149, 127
See application file for complete search history.

(56) References Cited

U.S. PATENT DOCUMENTS

| | | | |
|---|---|---|---|
| 3,961,280 A | 6/1976 | Sampei | 330/40 |
| 4,688,001 A | 8/1987 | Dijkmans et al. | 330/273 |
| 6,255,906 B1 * | 7/2001 | Eidson et al. | 330/124 R |
| 6,392,483 B2 * | 5/2002 | Suzuki et al. | 330/151 |
| 6,535,066 B1 * | 3/2003 | Petsko | 330/285 |
| 7,043,213 B2 * | 5/2006 | Robinson et al. | 455/127.2 |
| 7,498,876 B2 * | 3/2009 | Peruzzi et al. | 330/10 |
| 7,570,931 B2 * | 8/2009 | McCallister et al. | 455/126 |

OTHER PUBLICATIONS

"A 750MW Class G ADSL Line Driver with Offset-Controlled Amplifier Hand-Over" by D Vecchi and C. Morandi, IEEE 2003, pp. 253-258.
"Highest Efficiency and Super Quality Audio Amplifier Using MOS Power FETS in Class G Operation" by Sampei et al., IEEE Transactions on Consumer Electronics, vol. CE-24, No. 3, Aug. 1978, pp. 300-307.

* cited by examiner

*Primary Examiner*—Patricia Nguyen
(74) *Attorney, Agent, or Firm*—John J. Patti; Wade J. Brady, III; Frederick J. Telecky, Jr.

(57) ABSTRACT

Digital amplifying circuitry delays a digital data signal ($IN_R$) to produce an output signal ($Vout_R$). The delayed digital data signal is converted to an analog signal ($Vin_R$) for amplifying by an amplifier (10R). Signal amplitude information (S_R [n]) contained in the incoming digital data signal is detected during the delaying. The signal amplitude information is converted to a first control signal (S_Io_NEG[n]) in response to which an adjustable maximum available supply current of the amplifier is produced of least sufficient magnitude to avoid distortion during the amplifying to produce the output signal. The signal amplitude information also is converted to a second control signal (S_AMPLITUDE[n]) in response to which a supply voltage ($V_{NEG}$) of the amplifier is controlled.

21 Claims, 8 Drawing Sheets

ADAPTIVE SIGNAL-FEED-FORWARD CIRCUIT AND METHOD FOR REDUCING AMPLIFIER POWER WITHOUT SIGNAL DISTORTION

BACKGROUND OF THE INVENTION

The present invention relates generally to amplifier circuitry powered by power converter circuits, such as charge pumps and DC-DC converters, and more particularly to improvements which improve the power consumption efficiency of the amplifiers and associated power converter circuits in accordance with the amount of input-signal-dependent load power required from the amplifier and/or power converter circuit.

When a DC-DC converter, such as a charge pump or switching regulator, is used to provide power to an amplifier, the conventional approach is to use a fixed switching frequency and an output voltage amplitude that are determined by the peak power requirement of the worst case load condition. However, in most cases the power requirements of the amplifier load vary greatly over time. For example, the volume settings and dynamic range of music signals output by an audio amplifier to speakers or headphones may have large variations over time. This makes the power converter less power-efficient because it dissipates more power than necessary for a significant portion of the amplifier operating time. If the power converter switching frequency and the amplitude of its output voltage are not chosen for the worst case load condition, then the power converter circuitry may not be able to provide the power required by the amplifier during the signal-dependent peak load demand condition. This results in an undesirable signal-dependent voltage "droop" in the amplifier supply voltage provided by the power converter. This may degrade the performance of the amplifier that drives the load, for example by causing distortion in the output of an audio amplifier powered by the power converter.

The prior art includes a "class G" amplifier which uses feedback from the amplifier's output signal. This allows the amplifier's supply voltage to be reduced when the amplifier's output signal voltage is low and thereby reduces the average power consumption for the amplifier. For example, if at a particular time the amplifier output signal amplitude is small, the amplifier's supply voltage can be reduced without introducing distortion in the amplified output signal. However, this class G feedback approach suffers from a feedback lag whereby the supply voltages provided to the amplifier do not respond/settle fast enough to minimize distortion in the amplification, resulting in undesirable distortion of the output signal produced by the amplifier. Specifically, since the amplifier's supply voltage also must have been adjusted and must have settled prior to the arrival of the amplifier's input signal, delay that occurs during any such feedback technique to adjust the amplifier supply voltage can produce undesirable effects, especially such as causing distortion in the amplifier's output signal. For example, if the amplitude of the amplifier input signal jumps from a low level to a high level, the amplifier's supply voltage may also have to increase to accommodate the power requirements of the load. If the amplifier's supply voltage does not increase fast enough either because of delay through feedback or through a feed-forward loop and/or a DC-DC converter, then, for a short time interval, the amplifier will not have the required voltage "head room" to drive the load without causing distortion of the output signal.

It is believed that there also may be various prior art techniques of feeding forward an incoming analog input signal of an amplifier and controlling the power consumption in the amplifier on the basis of the feed-forward information. However, in these prior art techniques there is always a delay of the feed-forward information. As mentioned above, this also results in undesirable distortion of the output signal produced by the amplifier.

Thus, there is an unmet need for power converter circuitry which is capable of supplying an input-signal-dependent supply voltage to an amplifier to enable it to supply the peak voltages required by a fixed load, wherein the amplifier is energy-efficient during time intervals in which less than peak voltage is required by the load.

There also is an unmet need for power converter circuitry which is capable of supplying an input-signal-dependent supply voltage to an amplifier to enable it to supply the peak current required by a fixed time-independent load, wherein the amplifier is energy-efficient during time intervals in which less than peak current is required by the load.

There also is an unmet need for charge pump circuitry or DC-DC converter circuitry which is capable of supplying power to an amplifier to enable it to supply the peak current required by a fixed load, wherein the power converter circuitry is energy-efficient during time intervals in which less than peak current is required by the load.

There also is an unmet need for a way to avoid distortion in the output of an amplifier powered by a power converter circuit due to signal-dependent ripple and droop in the supply voltage of the amplifier.

SUMMARY OF THE INVENTION

It is an object of the invention to provide a technique wherein a power converter for supplying power to an amplifier is controlled to supply imminent peak current and voltage requirements of the amplifier, wherein the power converter circuitry is energy-efficient during times in which less than peak current or voltage is required by a load.

It is another object of the invention to provide a technique wherein a power converter, for supplying voltage and current to an amplifier is controlled to supply imminent voltage and current requirements of the amplifier, wherein the amplifier is energy-efficient during time intervals in which less than peak voltage is required by a load.

It is another object of the invention to provide a way to avoid distortion in the output of an amplifier powered by a power converter circuit due to signal-dependent ripple and/or droop in the supply voltage provided to the amplifier.

Briefly described, and in accordance with one embodiment, the present invention provides digital amplifying circuitry that delays a digital data signal ($IN_R$) to produce an output signal ($Vout_R$). The delayed digital data signal is converted to an analog signal ($Vin_R$) for amplifying by an amplifier (10R). Signal amplitude information ($S\_R[n]$) contained in the incoming digital data signal is detected during the delaying. The signal amplitude information is converted to a first control signal ($S\_Io\_NEG[n]$) in response to which an adjustable maximum available supply current of the amplifier is produced of least sufficient magnitude to avoid distortion during the amplifying to produce the output signal.

In one embodiment, the invention provides circuitry for reducing power in a digital amplifying system, including a first digital delay circuit (7R) for receiving and delaying a first incoming digital data signal ($IN_R$) which represents a first analog input signal. A first digital-to-analog conversion circuit (4R) receives the delayed first digital data signal from the first digital delay circuit (7R) and converts the delayed first data to a first analog signal ($Vin_R$). A first amplifier (10R)

amplifies the first analog signal ($Vin_R$) to produce a first output voltage ($Vout_R$) applied to a first load (12R). A digital signal processing system (13) receives the first incoming data signal ($IN_R$), detects first signal amplitude information (15R/S_R[n]) contained in the first incoming digital data ($IN_R$), and converts the first signal amplitude information (S_R[n]) to a first digital control signal (S_Io_NEG[n]) to optimize power efficiency of the digital amplifying system. A power conversion circuit (27) converts the first digital control signal (S_Io_NEG[n]) to an adjustable maximum available supply current ($I_{BIAS}$+Io_NEG) in a first supply conductor (29N) of the first amplifier circuitry (10R) of at least sufficient magnitude to avoid distortion during the amplifying of the first analog signal ($Vin_R$) to produce the first output voltage ($Vout_R$).

In one embodiment, the power conversion circuit (27) includes a charge pump (28) which produces the adjustable maximum available supply current ($I_{BIAS}$+Io_NEG) so as to maintain a first supply voltage ($V_{NEG}$) on the first supply conductor (29N), switching of the charge pump (28) being controlled by a first clock signal (FCLKN). The digital signal processing system (13) performs a first mapping function (46) to map the first digital control signal (S_Io_NEG[n]) to a first code (FCLK_NEG[n]) for selecting a first predetermined frequency ($f_{FCLKN}$) of the first clock signal (FCLKN) to optimize power consumption of the charge pump (28). A first digitally controllable oscillator circuit (24N) produces the first clock signal (FCLKN) in response to the first code (FCLK_NEG[n]).

In one embodiment, a programmable DC-DC converter (33) produces an adjustable second supply voltage ($V_{POS}$) which is applied by means of a second supply voltage conductor (29P) to a high-side supply terminal of the first amplifier (10I), low-side supply terminals of the charge pump (28) and the DC-DC converter (33) being coupled to a first reference voltage (GND), switching of the DC-DC converter (33) being controlled by a second clock signal (FCLKP).

In one embodiment, the digital processing system (13) converts the first signal amplitude information (S_R[n]) to a second digital control signal (S_AMPLITUDE[n]) and performs a second mapping function (44) to map the second digital control signal (S_AMPLITUDE[n]) to a second code (AMPLITUDE ADJUST) for selecting a predetermined value of the second supply voltage ($V_{POS}$), the charge pump (28) generating the first bias voltage ($V_{NEG}$) in response to the second supply voltage ($V_{POS}$). The digital processing system (13) converts the first signal amplitude information (S_R[n]) to a third digital control signal (S_Io_POS[n]) to optimize power consumption of the DC-DC converter 33. In one embodiment, the digital signal processing system (13) performs a third mapping function (45) to map the third digital control signal (S_Io_POS[n]) to a third code (FCLK_POS[N]) for selecting a second predetermined frequency ($f_{FCLKP}$) of the second clock signal (FCLKP) to optimize power consumption of the DC-DC converter (33). A second digitally controllable oscillator circuit (24P) produces the second clock signal (FCLKP) in response to the third code (FCLK_POS[N]).

In a described embodiment, the first digital delay circuit (7R) delays the first incoming digital signal ($IN_R$) at least enough to ensure that the first analog signal ($Vin_R$) does not arrive at an input of the first amplifier (10R) until any voltage droop or voltage ringing of the first supply voltage ($V_{NEG}$) due to adjustment of the adjustable maximum available supply current in response to the first digital control signal (S_Io_NEG[n]) has settled.

In a described embodiment, the digital signal processing system (13) includes a first finite impulse response (FIR) filter (14R) that performs a detecting of the first signal amplitude information (S_R[n]) by receiving and filtering the first incoming digital data ($IN_R$). The digital signal processing system (13) multiplies each of a plurality of samples (n) of the first signal amplitude information (S_R[n]) by a digital representation (GAIN) of a gain of the first amplifier (10R) and by a digital representation of a load impedance ($Z_L$) of the first load (12R) for each sample (n) of the first signal amplitude information (S_R[n]).

In a described embodiment, the first digital delay circuit (7R), the first digital-to-analog conversion circuit (4R), the first amplifier (10R), the first load (12R), and the first finite impulse response filter (14R) are included in a first signal channel, the circuitry also including a second signal channel. A second signal channel includes the second digital delay circuit (7L) which receives and delays a second incoming digital data signal ($IN_L$) that represents a second analog input signal, a second digital-to-analog conversion circuit (4L) for producing a second analog signal ($Vin_L$), a second amplifier (10L) having a low-side supply terminal connected to the first supply conductor (29N) for amplifying the second analog signal ($Vin_L$) to produce a second output voltage ($Vout_L$) applied to a second load (12L), and a second finite impulse response filter (14L), all of which are substantially similar to those in the first signal channel. The digital signal processing system (13) receives a the second incoming data signal ($IN_L$), detects second signal amplitude information (15L/S_L[n]) contained in the second incoming digital data ($IN_L$), and combines the second signal amplitude information (S_L[n]) with the first signal amplitude information (S_R[n]) to generate the first digital control signal (S_Io_NEG[n]). The first supply conductor (29N) is connected to a low-side supply terminal of the second amplifier (10L). The power conversion circuitry (27) converts the first digital control signal (S_Io_NEG[n]) to the adjustable maximum available supply current in the low-side supply terminals of the first (10R) and second (10L) amplifiers of at least sufficient magnitude to avoid distortion during the amplifying of the first ($Vin_R$) and second ($Vin_L$) analog signals to produce the first ($Vout_R$) and second ($Vout_L$) output voltages.

In one embodiment, the invention provides a method for reducing power dissipated in a digital amplifying system, including delaying an incoming digital data signal ($IN_R$), converting the delayed digital data signal to an analog signal ($Vin_R$) to be amplified by an amplifier (10R) to produce an output signal ($Vout_R$), detecting signal amplitude information (S_R[n]) contained in the incoming digital data ($IN_R$) during the delaying, converting the signal amplitude information (S_R[n]) to a first digital control signal (S_Io_NEG[n]), and producing an adjustable maximum available supply current of the amplifier (10R) in response to the first digital control signal (S_Io_NEG[n]) such that the adjustable maximum available supply current of the amplifier (10R) has at least sufficient magnitude to avoid causing signal distortion during amplifying of the analog signal ($Vin_R$) by means of the amplifier (10R) to produce the output signal ($Vout_R$).

In one embodiment, the method includes performing the converting of the first digital control signal (S_Io_NEG[n]) to the adjustable maximum available supply current of the amplifier (10R) by controlling a first clock signal (FCLKN) that controls a switching frequency ($f_{FCLKN}$) of a charge pump (28) so as to maintain a predetermined value of a first supply voltage ($V_{NEG}$) on a first supply conductor (29N) of the amplifier (10R) during time-varying load currents. The predetermined value of the first supply voltage ($V_{NEG}$) is set in response to a second supply voltage ($V_{POS}$) applied to a high-side supply voltage conductor (29P) of the amplifier (10R) produced by a programmable DC-DC converter (33), by converting the signal amplitude information (S_R[n]) to a second digital control signal (S_AMPLITUDE[n]). The programmable DC-DC converter (33) is controlled in response to the second digital control signal (S_AMPLITUDE[n]) to produce a predetermined value of the second supply voltage ($V_{POS}$). The first supply voltage ($V_{NEG}$) is generated in response to the second supply voltage ($V_{POS}$) by means of the charge pump (28).

In one embodiment the method includes converting the signal amplitude information (S_R[n]) to a third digital control signal (S_Io_POS[n]) and controlling a second clock signal (FCLKP) which controls a switching frequency ($f_{FCLKP}$) of the programmable DC-DC converter (33) in response to the third digital control signal (S_Io_POS[n]) so as to optimize power dissipation in the programmable DC-DC amplifier (33). Each of a plurality of samples (n) of the signal amplitude information (S_R[n]) is multiplied by a digital representation (GAIN) of a gain of the amplifier (10R) and by a digital representation of a load impedance ($Z_L$) of the load (12R) for each sample (n) of the signal amplitude information (S_R[n]) to produce each of the first (S_Io_NEG[n]) and third (S_Io_POS[n]) digital control signals.

In one embodiment, the invention provides a circuit for reducing power in a digital amplifying system, including means (7) for delaying an incoming digital data signal ($IN_R$) to produce an output signal ($Vout_R$), means (4) for converting the delayed digital data signal to an analog signal ($Vin_R$) to be amplified by an amplifier (10R), and means (13) for detecting signal amplitude information (S_R[n]) contained in the incoming digital data ($IN_R$) during the delaying, means (40) for converting the signal amplitude information (S_R[n]) to a first digital control signal (S_Io_NEG[n]), and means (46, 24N,28) for producing an adjustable maximum available supply current of the amplifier (10R) in response to the first digital control signal (S_Io_NEG[n]) such that the adjustable maximum available supply current of the amplifier (10R) has at least sufficient magnitude to avoid distortion during amplifying of the analog signal ($Vin_R$) by means of the amplifier (10R) to produce the output signal ($Vout_R$).

DETAILED DESCRIPTION OF THE PREFERRED EMBODIMENTS

The present invention increases the power efficiency of an amplifier and a power conversion circuit, such as a charge pump or switching regulator for biasing the amplifier, wherein the amplifier supplies varying amounts of signal-dependent output current to a load. The load typically is fixed, i.e., time-independent. For example, the power efficiency of the charge pump or the switching regulator (or the like), together with the amplifier, can be varied by adjusting the switching frequency of the power converter, and optionally by also varying the output voltage of the power converter, according to the voltage and current demands of the amplifier and load. In accordance with the present invention, the adjustment of the switching frequency is accomplished by "looking ahead" at incoming digital data before it is converted to an analog signal and applied to the input of the amplifier. As an example, it might be known in advance, by digitally analyzing the incoming digital data, that are there will be imminent "loud" signals (i.e., signals representing loud sounds to be emitted from one or more speakers of an audio system) during the next minute fraction of a second.

Figure 1A:
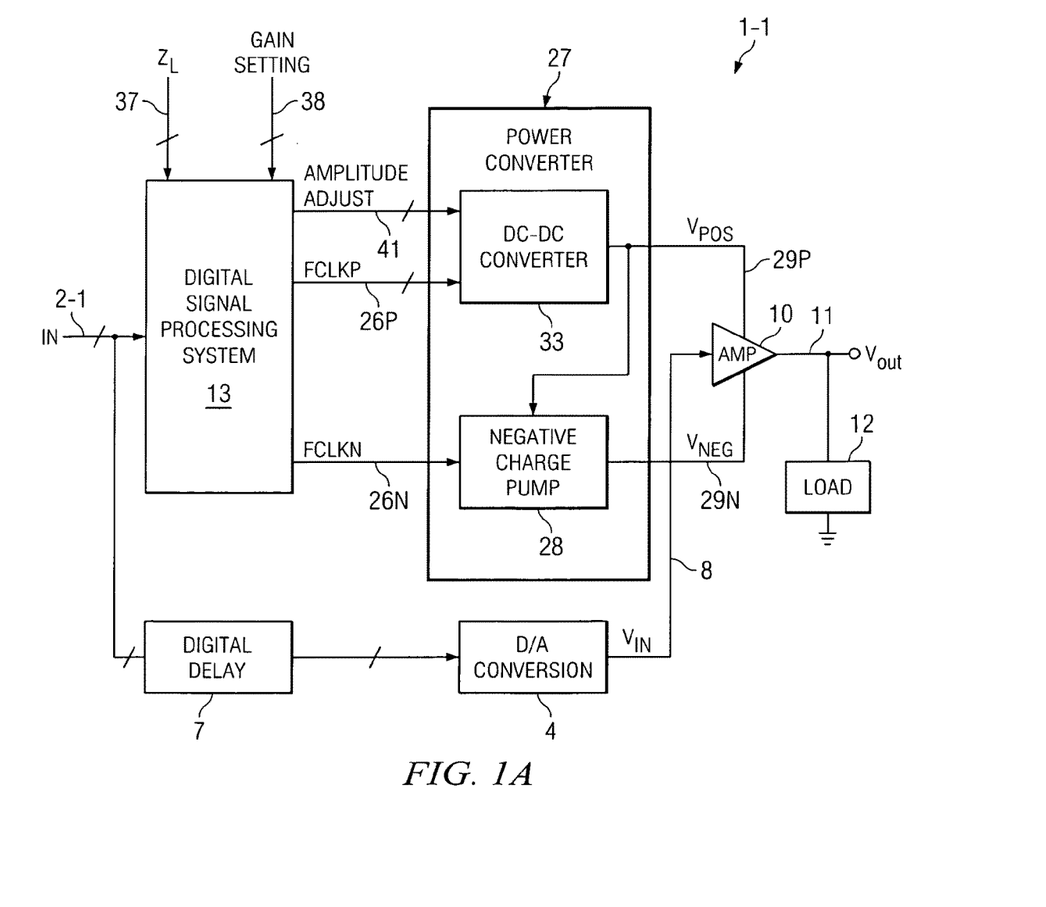
FIG. 1A is a top level block diagram of an audio amplifying system of the present invention.

FIG. 1A shows a top level block diagram of an audio system 1-1 which receives digital audio bit stream IN on bus 2-1. Digital audio bit stream IN on conductor 2-1 can be received from a digital storage medium, such as a hard drive, a flash memory, or other kind of memory device. In this example, digital audio bit stream IN is in a conventional delta-sigma format. (Delta-sigma audio data is pulse-density-modulated data, the pulse density of which is modulated in accordance with the amplitude of an analog waveform represented by the digital audio bit stream IN.) However, the digital audio input bit stream IN can be in other formats than a digital delta-sigma data format.

Audio bit stream IN is applied as an input to a "first signal path" including a digital delay circuit 7, a digital-to-analog conversion circuit 4, an amplifier 10, and a load 12 which typically is a speaker. In accordance with the present invention, digital audio bit stream IN is also applied as an input to a "second signal path" including digital signal processing system 13 and a power converter 27 which receives digital amplitude information from digital signal processing system 13 indicative of the time-varying amplitude of an analog input signal Vin on conductor 8 that imminently is to be received at the input of amplifier 10 from the output of digital-to-analog conversion circuit 4. In response to the digital amplitude information, which includes an amplitude adjustment signal AMPLITUDE ADJUST on bus 47 and at least an adjustable-frequency clock signal FCLKN on conductor 26N in response to digital processing system 13, power converter 27 produces a high-side supply voltage $V_{POS}$ and a low-side supply voltage $V_{NEG}$ which are applied to the high-side and low-side supply voltage terminals, respectively, of amplifier 10.

The value of the differential supply voltage $V_{NEG}-V_{POS}$ applied to amplifier 10 in effect is controlled so as to be sufficient to ensure that the analog input signal Vin produced on conductor 8 by digital-to-analog conversion circuit 4 and applied to the input of amplifier 10 is amplified without distortion, to thereby produce a distortion-free output signal Vout that is applied to load or speaker 12. (By way of definition, the voltage difference $V_{POS}$–$V_{NEG}$ applied between the high-side and low-side supply voltage terminals of the amplifier is occasionally referred to herein as the "amplifier supply voltage".)

Power converter 27 may include a conventional buck converter 33, which is a common kind of DC-DC converter, to generate values of $V_{NEG}$ and $V_{POS}$ on conductor 29P. $V_{POS}$ also is connected to provide a positive supply voltage to a conventional negative charge pump 28 which generates $V_{NEG}$. The clock signal FCLKN, and preferably also clock signal FCLKP, control the charge-switching operations internal to charge pump 28 and DC-DC converter 33, respectively, and the frequencies $f_{FCLKN}$ of FCLKN and $f_{FCLKP}$ of FCLKP therefore control their respective energy efficiencies. (However, in some cases it is not necessary that power converter 27 provide $V_{POS}$ because the positive system supply voltage (such as $V_{DD}$ or $V_{SUPPLY}$) can be used instead on conductor 29P. In such a case, DC-DC converter 33 and FCLKP can be omitted.)

In accordance with the present invention, the above mentioned delay through digital delay circuit 7 is provided to allow the processing in digital signal processing system 13 to be completed slightly before the analog signal Vin arrives at the input of amplifier 10, so as to allow sufficient time for $V_{NEG}$ to be adjusted to an appropriate value in response to the signal AMPLITUDE ADJUST and then settle to its desired value before Vin is amplified. If $V_{POS}$ is generated by power converter 27, digital delay circuit 7 also allows sufficient time for $V_{POS}$ to be adjusted to an appropriate value in response to AMPLITUDE ADJUST and then settle to its desired value before Vin is amplified. This prevents distortion from being introduced during the amplification of Vin to produce Vout. (Note that Vin and Vout can be either differential or single-ended signals.)

Increasing/decreasing the charge pump frequency increases/decreases the amount of charge transferred from the supply voltage to the pump's output within a certain time span. The charge pump's output then supplies the amplifier and provides more/less current to directly accommodate the variation in the load current Io_NEG required by the amplifier's load. IBIAS is the constant bias current for the amplifier. The present invention adjusts charge pump frequency $f_{FCLKN}$ in response to anticipated load current requirements. Specifically, the signal S_Io_NEG[n] is used to adjust the frequency $f_{FCLKN}$ of charge pump clock FCLKN. Therefore, $f_{FCLKN}$ sets the maximum current that can flow into the charge pump holding capacitor without $V_{NEG}$ going out of regulation. Charge pump 28 can be thought of as a negative voltage source that can sink up to some maximum amount of current before $V_{NEG}$ starts to be pulled up. The described embodiments of the invention thus adjust the maximum available current level to accommodate the imminently anticipated load current.

The higher the charge pump switching frequency $f_{FCLKN}$ of FCLKN, the more current the charge pump can sink without causing $V_{NEG}$ to droop. Therefore, the more current that flows into the $V_{NEG}$ terminal, the faster the charge pump frequency needs to be. Only the load current that flows into the amplifier's output terminal and into the charge pump 28, which represents the negative (i.e., flowing into the amplifier) time varying load current, affects the optimal value of the charge pump frequency $f_{FCLKN}$ On the other hand, only the positive load currents that flow out of the positive power converter $V_{POS}$ terminal, which represents the positive time varying load current, affects the optimal value of the positive voltage converter's clock frequency $f_{FCLKP}$. The amplifier's bias current, $I_{BIAS}$, does flow directly from the $V_{POS}$ terminal of the positive power converter 33 to the negative power converter 28, but it is not signal dependent and time varying and therefore it does not affect the time varying of the clock frequencies FCLKN and FCLKP.

Charge pump 28 operates so as to keep its output voltage $V_{NEG}$ constant at a desired level. However, if a large amount of current is being required by amplifier 10 at a time during which the frequency of FCLKN is too low, then $V_{NEG}$ will start to rise from its desired value, e.g. −2.7 V. That rise is referred to herein as "ripple" or "droop" in the value of $V_{NEG}$ and hence also in the value of the supply voltage $V_{POS}$–$V_{NEG}$ applied to amplifier 10. The frequency of FCLKN is adjusted on the basis of the above mentioned digital analysis of the amplitudes of the incoming digital audio signal IN (from which the analog signal Vin is converted) in such a way as to maintain $V_{NEG}$ constant at its desired value as the signal-dependent amount of output power demanded by the speaker 12 varies.

The above described adjusting of the frequency $f_{FCLKN}$ of clock signal FCLKN as needed to maintain a particular value of $V_{NEG}$ while supplying a signal-dependent amount of current demanded by speaker 12 has the effect of increasing the overall energy efficiency of power converter 27. The above described adjusting of frequencies $f_{FCLKN}$ and $f_{FCLKP}$ of clock signals FCLKN and FCLKP, respectively, allows the power conversion to run more efficiently than if run at a fixed frequency while not allowing the time varying load currents to exceed the maximum available current from the power converters 28 and 33, which would cause distortion at the load 12. The improved efficiency is due to the reduction of DC-DC converter switching losses at lower clock frequencies.

As an example of the operation of power converter 27, DC-DC converter 33, if utilized, might receive supply voltages $V_{SUPPLY}$=5 V and ground and produce an output voltage $V_{POS}$ of +3 V. The +3 V value of $V_{POS}$ would be applied as the positive supply voltage of charge pump 28, which then might generate a −3 V value of $V_{NEG}$. The other supply voltage of charge pump 28 would be ground. Thus, in the embodiment shown in FIG. 1A, $V_{POS}$ and $V_{NEG}$ can be adjusted together, in response to the signal AMPLITUDE ADJUST. Then, the value of $V_{POS}$ produced by DC-DC converter 33 might shift to 2 V in response to a change in the signal AMPLITUDE ADJUST, which then would cause charge pump 28 to produce a −2 V value of $V_{NEG}$ instead of the foregoing −3 V value. In many applications it might be advantageous to be able to adjust both the switching frequency of charge pump 28 and power converter 33 and the amplitude of output voltage of $V_{NEG}$ and $V_{POS}$ in response to amplitude information digitally determined from IN.

The incoming digital data IN may or may not be received from some kind of storage medium such as a flash memory, hard drive, or DVD disc. In any case, it should be appreciated that in the example of FIG. 1A, the digital data bit stream IN is digitally analyzed "on-the-fly" by digital signal processing system 13, with the amplitude-detection results of the analyzing being fed forward in advance to control the amplifier supply voltage difference $V_{POS}$ $V_{NEG}$. (This is also true for the embodiment of the invention shown in subsequently described FIG. 1B.) Enough delay is provided in the above mentioned "first signal path" that Vin does not arrive at the input of amplifier 10 until immediately after $V_{POS}$–$V_{NEG}$ been adjusted and has settled to a desired value before Vin is amplified and the resulting distortion-free value of Vout is applied to speaker 12. (However, the digital amplitude information of the audio bit stream IN could be obtained in advance from a storage medium from which IN is produced and then stored in a look-up table in an audio system such as the one shown in FIG. 1A. The digital amplitude information then could be retrieved from the look-up table in synchronization with the digital audio bit stream IN so as to achieve the previously described reduction in power consumption without distortion of Vout.)

Figure 1B:
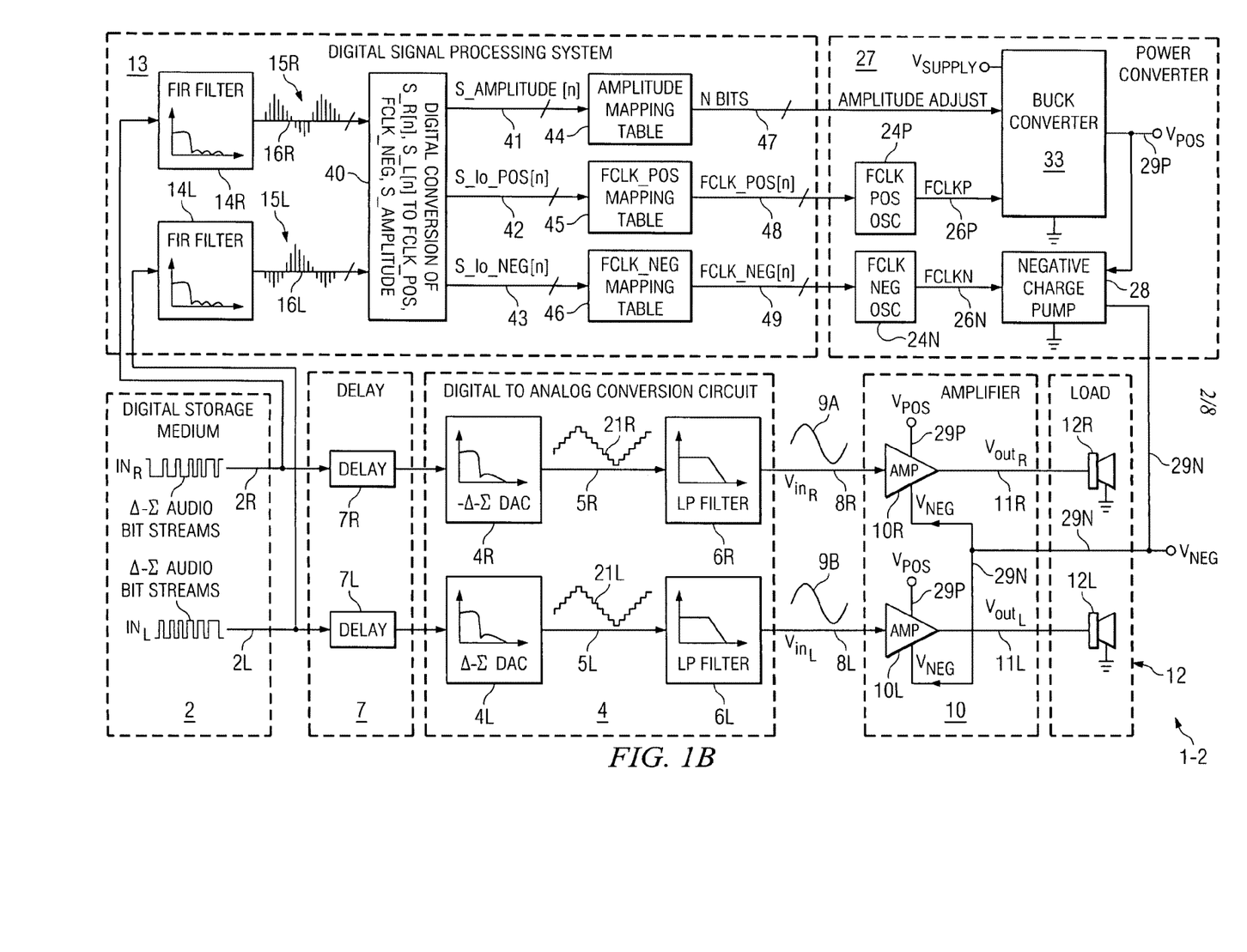
FIG. 1B is a detailed block diagram of a particular implementation of the audio system of FIG. 1A.

FIG. 1B shows a more detailed implementation of the audio system of FIG. 1A. In FIG. 1B, audio system 1-2 receives a right-channel digital audio bit stream $IN_R$ on conductor 2R and a left-channel digital audio bit stream $IN_L$ on conductor 2L from a digital storage medium 2, which can be a hard drive, a flash memory, or other kind of memory device. Both of digital audio bit streams $IN_R$ and $IN_L$ are in a conventional delta-sigma format. Audio bit streams $IN_R$ and $IN_L$ are applied as inputs to the above mentioned first signal path including digital delay circuit 7, digital-to-analog conversion circuit 4, amplifier circuitry 10, and load circuitry 12. Digital audio bit streams $IN_R$ and $IN_L$ are also applied as inputs to the previously mentioned second signal path including digital signal processing system 13.

The above mentioned second signal path also includes power converter 27 which receives digital information from digital signal processing system 13 indicative of the amplitude of analog amplifier input signals $Vin_R$ and $Vin_L$ that imminently are to be received at the inputs of amplifier circuitry 10. In response to the digital information from digital processing system 13, power converter 27 then produces a low-side supply voltage $V_{NEG}$ on conductor 29N and a high-side supply voltage $V_{POS}$ on conductor 29P which are applied to the low-side and high-side supply voltage terminals (i.e., rails), respectively, of amplifier circuitry 10. Power converter 27 includes DC-DC converter 33 and negative charge pump 28 as in FIG. 1A, to generate $V_{NEG}$ and $V_{POS}$ in such a way that the amplifier supply voltage $V_{POS}-V_{NEG}$ is sufficient to ensure that the analog input signals $Vin_R$ and $Vin_L$ produced by digital-to-analog conversion circuit 4 are sufficiently delayed before being applied to the inputs of amplifier circuitry 10 that they are amplified without distortion, whereby $Vout_R$ and $Vout_L$ are free of distortion. DC-DC converter 33 receives a positive supply voltage $V_{SUPPLY}$ and ground.

More specifically, $IN_R$ is applied to the input of a right-channel digital delay circuit 7R, the output of which is applied as an input to a right-channel digital-to-analog converter (DAC) 4R in digital-to-analog conversion circuit 4. The output signal 21R produced by DAC 4R on conductor 5R is coupled to the input of a right-channel low-pass filter 6R in digital-to-analog conversion circuit 4. Similarly, $IN_L$ is applied to the input of a left-channel digital delay circuit 7L, the output of which is applied as an input to a left-channel DAC 4L in digital-to-analog conversion circuit 4. The output signal 21L produced by DAC 4L on conductor 5L is coupled to the input of a left-channel low-pass filter 6L in digital-to-analog conversion circuit 4. (The implementation of digital-to-analog conversion circuit 4 of FIG. 1B is straightforward. For example, the assignee provides numerous commercially available products that include digital-to-analog conversion circuits capable of performing the digital-to-analog conversion function of block 4. Digital delay circuits 7R and 7L each can be easily implemented as a string of flip-flops. Note that it would be very costly in terms of die area to implement an equivalent analog delay element.)

Note that the delay through digital delay circuits 7R and 7L is necessary to allow the processing in digital signal processing system 13 to be completed slightly before the analog amplifier input signals $Vin_R$ and $Vin_L$ arrive at the inputs of amplifiers 10R and 10L. This delay allows $V_{POS}$ and $V_{NEG}$ to be adjusted and then settle to their desired values before $Vin_R$ and $Vin_L$ are amplified. The digital delay in delay elements 7R and 7L should slightly exceed the total signal delay through digital signal processing logic circuit 13 and power converter 27. This prevents distortion as $Vin_R$ and $Vin_L$ are amplified to produce $Vout_R$ and $Vout_L$, respectively.

The output $Vin_R$ produced on conductor 8R by low pass filter 6R is connected to the input of right-channel amplifier 10R, the output 11R of which drives a right-channel speaker 12R. The output $Vin_L$ produced on conductor 8L by low pass filter 6L is connected to the input of an amplifier 10L, the output 11L of which drives a left-channel speaker 12L. The gain of amplifiers 10R and 10L is programmable, for example by means of a digitally programmable feedback resistor array of each amplifier. (Speakers 12R and 12L and amplifiers 10R and 10L all may be included in a headphone assembly.)

$IN_R$ is also applied to the input of a right-channel finite input response (FIR) filter 14R in the above mentioned "second signal path" of digital signal processing system 13. Similarly, $IN_L$ is also applied to the input of a left-channel finite input response (FIR) filter 14R in the "second signal path" of digital signal processing system 13. Digital signal processing system 13 analyzes amplitude information in the two incoming digital input signals $IN_R$ and $IN_L$ and adjusts the frequency $f_{FCLKN}$ of charge pump clock FCLKN and the frequency $f_{FCLKP}$ of positive power converter clock FCLKP in accordance with the analyzed amplitude information in order to determine in advance the amplitude adjust voltage and the current requirements, respectively, of the two amplifiers 10R and 10L. Digital signal processing system 13 performs the functions of digital filtering, digital load impedance emulation, and digital gain scaling of the digital input signals $IN_R$ and $IN_L$, and using that information for calculation of a time varying digital signal that represents load currents that will flow through amplifiers 10L and 10R to load elements 12L and 12R, respectively.

The total load current demanded to be supplied to the load elements 12L and 12R through amplifiers 10R and 10L is referred to herein as current Io_POS, Io_NEG, and the corresponding digital current information corresponding to the total load current also is occasionally referred to as herein as S_Io_POS, S_Io_NEG. Digital signal processing 13 also performs the function of mapping the amplitude of the digitally calculated values of S_Io_POS, S_Io_NEG to corresponding values of the charge pump switching frequency $f_{FCLKN}$ of clock signal FCLKN and the switching frequency $f_{FCLKP}$ of positive voltage converter clock signal FCLKP.

The discrete-time, discrete-amplitude digital signals 15R and 15L are produced by FIR filters 14R and 14L and are applied as inputs to digital signal processing block 40, which performs the functions of the digital conversion of discrete digital signal values S_R[n] and S_L[n] to discrete digital signals S_Io_POS[n] on bus 42, S_Io_NEG[n] on bus 43, and S_AMPLITUDE[n] on bus 41, where (n) represents successive discrete points in time at which digital bits pass through digital signal processing system 13. (A better representation of digital signals 15R and 15L is shown in subsequently described FIG. 7.) Bus 41 is connected to an amplitude mapping DSP lookup table 44 which performs the function of mapping S_AMPLITUDE[n] to values of AMPLITUDE ADJUST on N-bit bus 47. Bus 42 is connected to a FCLK_POS mapping DSP look-up table 45 which performs the function of mapping S_Io_POS[n] to a digital number on N-bit bus 48 which represents $f_{FCLKP}$ (i.e., the frequency of FCLKP). Bus 43 is connected to a FCLK_NEG mapping DSP look-up table 46 which performs the function of mapping S_Io_NEG[n] to a digital number on N-bit bus 49 which represents $f_{FCLKN}$ (i.e., the frequency of FCLKN). Mapping DSP lookup tables 44, 45, and 46 can be readily implemented by means of conventional digitally programmable read-only memories (ROMs).

Figure 7:
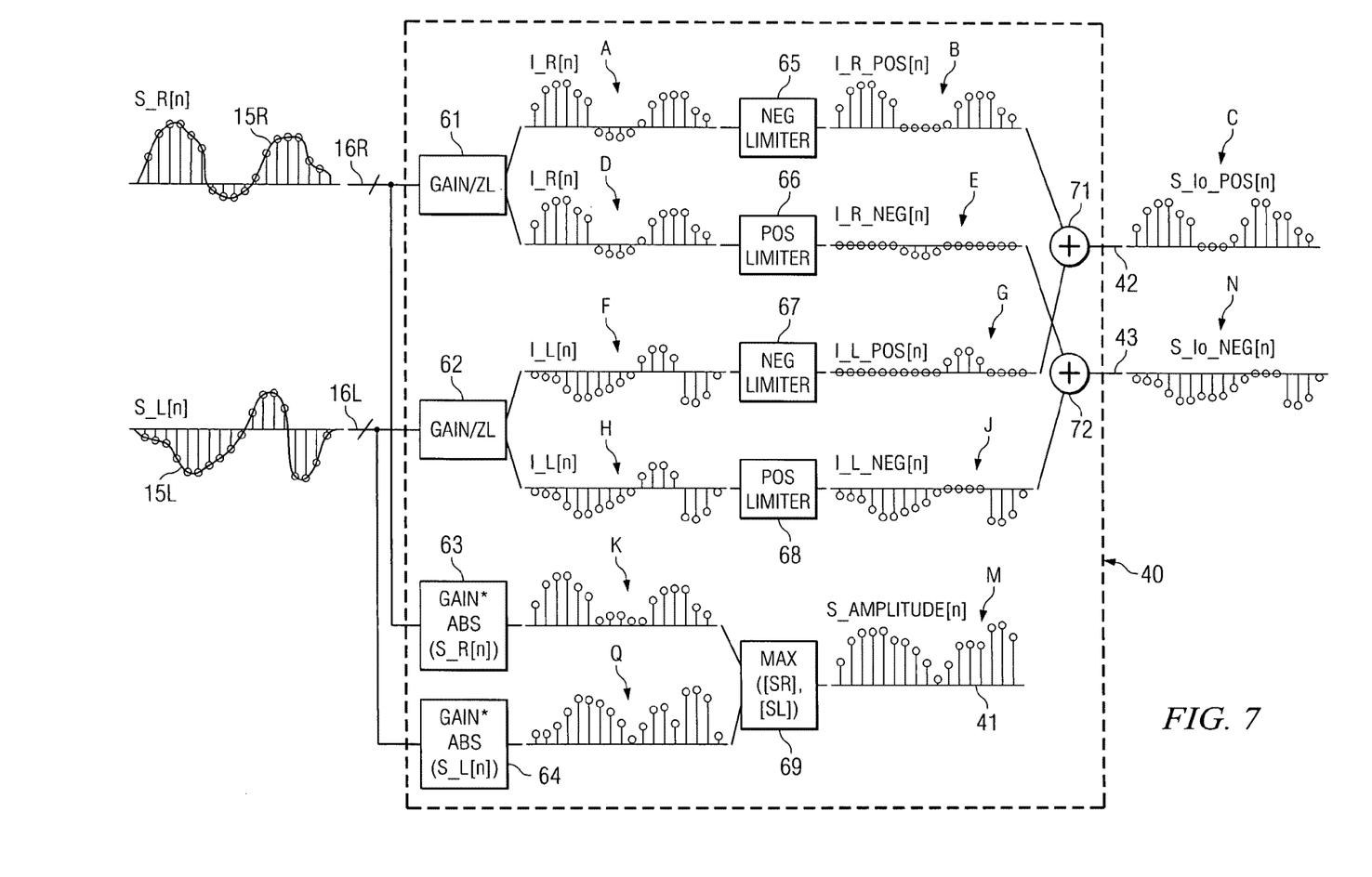
FIG. 7 is a detailed block diagram of block 40 that shows the processing necessary to produce digital control signals S_Io_POS[n], S_Io_NEG[n], and S_Amplitude[n] from signal amplitude information S_R[n] and S_L[n].

The structure and operation of the digital signal processing that occurs in block 40 of FIG. 1B are indicated in FIG. 7, which illustrates the digital signal processing operations performed in DSP block 40 to convert discrete-time, discrete-amplitude digital signals 15R (i.e., S_R[n]) and 15L (i.e., S_L[n]) to the 3 discrete digital signals S_AMPLITUDE[n], S_Io_POS[n], and S_Io_NEG[n] on buses 41, 42 and 43, respectively. The discrete digital signal 15R is applied via bus 16R to one input of block 40 in FIG. 7, and the discrete digital signal 15L is applied via bus 16L to the other input of block 40. Waveforms 15R and 15L are discrete-time, discrete-amplitude representations of the analog audio data represented by the delta-sigma audio data $IN_R$ and $IN_L$ after it is filtered by FIR filters 14R and 14L, respectively. The other waveforms A, B, C etc. in FIG. 7 also are discrete-time, discrete-amplitude representations of signals produced in the course of the digital signal processing operations in block 40. The above mentioned digital signals on buses 41, 42, and 43 are the signals illustrated as waveforms M, C, and N at the output of maximum amplitude detector block 69, digital adder block 71, and digital adder block 72.

The gain term "GAIN" in digital signal processing blocks 61, 62, 63, and 64 is equal to the value of a programmable digital gain setting of each of amplifiers 10R and 10L, and the term "$Z_L$" in blocks 61 and 62 is equal to the impedance of each of speakers 12R and 12L in FIG. 1B. The process performed in digital signal processing block 61, for each discrete time value n, is to multiply the corresponding value of signal 15R by the product of the amplifier gain value GAIN and then perform "digital load impedance emulation" to obtain the signals I-R[n] and I-L[n] in FIG. 7. I_R[n] and I_L[n] are the digital equivalent of the analog currents that will flow in loads 12R and 12L, respectively. Digital load impedance emulation consists of converting the differential equations that describe the load elements 12R and 12L, including their complex impedance, to difference equations that can be solved in the digital domain. (This is because the gain value GAIN of amplifiers 10 and the impedance of the speakers 12 must be accounted for in the processing of digital signals 15R and 15L to obtain the values of digitally calculation currents S_Io_POS[n] and S_Io_NEG[n] needed to achieve optimum power consumption in DC-DC converter 33, charge pump 28, amplifiers 10, and speakers 12.) The result of the processing in digital signal processing function block 61 is to scale or convert signal 15R, which can be represented by S_R[n], into a pair of identical discrete-time, discrete-amplitude signals represented by waveforms A and D. Similarly, the result of the processing in digital signal processing block 62 is to scale or convert signal 15L, which can be represented by S_L[n], into a pair of identical discrete-time, discrete-amplitude signals represented by waveforms F and H, respectively. The digital signals A and D represent the same analog domain current, which can be represented by I_R[n], that imminently will flow in right channel speaker 12R, and digital signals F and H represent the same analog domain current, which can be represented by I_L[n], that imminently will flow in left channel speaker 12L. This is because signals 15R and 15L are voltage signals which are multiplied by GAIN and then converted to currents by performing impedance emulation in the digital domain. (As a practical matter, the complex load impedance $Z_L$ can be represented or "emulated" by means of a set of coefficients in difference equations. The difference equations enable the digital load current representation Io to be calculated in the digital domain.)

Negative digital signal processing limiter block 65 operates to replace the discrete-time negative values of waveform A by replacing all negative values by zeroes, to produce the digital values of current I_R_POS[n] that constitute waveform B. Similarly, positive digital limiter function block 66 replaces positive values of waveform D by zeros to produce the discrete-time digital values of current I_R_NEG[n] that constitute waveform E. Waveforms B and E are fed into one input of digital adder function block 71 and one input of digital adder function block 72, respectively. Similarly, negative digital limiter function block 67 replaces negative values of waveform F by zeros to produce the discrete-time digital values of current I_L_POS[n] that constitute waveform G, and positive digital limiter function block 68 replaces the positive values of waveform by zeros to produce the discrete-time digital values of current I_L_NEG[n] that constitute waveform J. Waveforms G and J are fed into a second input of digital adder 71 and a second input of digital signal processing adder 72, respectively.

Note that the sum of the two discrete-time, discrete-amplitude signals I_R_NEG[n] and I_L_NEG[n], which is the signal S_Io_NEG[n] produced by adder 72 on bus 43, can be thought of in the analog domain as representing the sum of the currents from both right and left amplifiers that flow into the negative charge pump (Io_NEG_R+Io_POS_L, see FIG. 7). The sum of the two discrete-time, discrete-amplitude signals I_R_POS[n] and I_L_POS[n], which is the signal S_Io_POS [n] produced by adder 71 on bus 42, can be thought of in the analog domain as representing the sum of the currents from both right and left amplifiers that flow out of the positive power converter (Io_POS_R+Io_POS_L, see FIG. 4).

It should be appreciated that when power is applied by DC-DC converter 33 to an amplifier, e.g. amplifier 10R which has positive supply voltage rail 29P and negative supply voltage rail 29N, then when $Vin_R$ increases this causes increased amplifier supply current (i.e., current flow through the amplifier to the load) to flow out of DC-DC converter 33 into positive rail 29P, out of the amplifier's output node 11R (and 11L), and through the load element 12R (and 12L). When $Vin_R$ decreases, amplifier supply current flows out of the ground node connected to the load into negative charge pump converter 28. This makes it advantageous to use separate converters, i.e., DC-DC converter 33 and negative charge pump 28, to sink and supply bias current to amplifier 10R in order to be able to optimally control power consumption by adjusting $f_{FCLKN}$ and $f_{FCLKP}$. Since conductor 29N is the negative supply voltage rail for both right channel amplifier 10R and left channel amplifier 10L, it is necessary to add the two currents represented by waveforms E and J together, because negative charge pump 28 must sink both of those currents and both must be taken into account to determine which value of $f_{FCLKN}$ will best optimize power consumption in charge pump 28 for the imminent levels of $Vin_R$ and $Vin_L$. Also, waveforms B and G are added together because both currents represented thereby must be taken into account to determine what value of $f_{FCLKP}$ will best optimize power consumption in DC-DC converter 33.

The output of digital adder 71 then is the digital signal S_Io_POS[n] on bus 42 and is represented by waveform C, and the output of digital adder 72 is the digital signal S_Io_NEG[n] on bus 43 and is represented by waveform N.

Waveform K is generated by DSP function block 63, which determines the absolute value of each discrete amplitude, discrete time value, or sample n of signal 15R and multiplies by the amplifier gain value GAIN. Similarly, waveform Q is generated by DSP function block 64, which determines the absolute value of each discrete amplitude, discrete time value, or sample n of signal 15L and multiplies by the amplifier gain value GAIN. Each sample of waveforms K and Q are analyzed by the digital signal processing in block 69, which outputs the larger of the two signals K and Q for each n instance of time, in essence determining the maximum value of voltage of the imminent values of either $Vout_R$ or $Vout_L$ which will be produced by either amplifier 10R or 10L. That results in the signal S_AMPLITUDE[n] represented by waveform M on bus 41.

DSP Amplitude look-up mapping table function 44 in FIG. 1B receives successive discrete values of waveform M (i.e., S_AMPLITUDE[n]) on bus 41 and accordingly selects corresponding previously stored codes representative of values of $V_{POS}$ previously determined to result in optimum overall power consumption in DC-DC converter 33, negative charge pump 28, amplifiers 10, and speakers 12 without allowing distortion to be introduced as imminent signals $Vin_R$ and $Vin_L$ are being amplified to produce $Vout_R$ and $Vout_L$, respectively. Those codes constitute the digital signal AMPLITUDE ADJUST on bus 47, which is applied to an input of DC-DC converter 33 to control the value of $V_{POS}$ produced on positive amplifier supply voltage rail 29P. That causes negative charge pump 28 to produce a value of $V_{NEG}$ equal to $-V_{POS}$.

FCLKP look-up mapping table function 45 in FIG. 1B receives successive discrete values of waveform C (i.e., S_Io_POS[n]) of FIG. 7 on bus 42 and accordingly selects corresponding previously stored values of the frequency $f_{FCLKP}$ of FCLKP previously determined to result in optimum power consumption in DC-DC converter 33, without allowing distortion to be introduced by amplifiers 10 as imminent signals $Vin_R$ and $Vin_L$ are amplified to produce $Vout_R$ and $Vout_L$, respectively.

FCLKN look-up mapping table function 46 in FIG. 1B receives successive discrete values of waveform N (i.e., S_Io_NEG[n]) of FIG. 7 on bus 43 and accordingly selects corresponding previously stored values of the frequency $f_{FCLKN}$ of FCLKN previously determined to result in optimum power consumption in negative charge pump 28 with $V_{NEG}$ being maintained equal to $-V_{POS}$, and without allowing distortion to be introduced by amplifiers 10 as imminent signals $Vin_R$ and $Vin_L$ are amplified to produce $Vout_R$ and $Vout_L$, respectively. The voltage difference $V_{POS}-V_{NEG}$ between the high-side and low-side supply voltages that audio amplifiers 10R and 10L require in order to amplify the imminent signals $Vin_R$ and $Vin_L$ without introducing distortions is directly a function of the amplitudes of the amplifier output signals $Vout_R$ and $Vout_L$ to be supplied to speakers 12R and 12L, and also is proportional to the amplifier gain setting (i.e. to GAIN SETTING, FIG. 1A) and the amplitudes of the analog input signals represented by digital input signals $IN_R$ and $IN_L$.

As an example, the digital feed-forward method can be applied to an audio amplifier using only one power converter 28 to produce a negative amplifier rail voltage. The positive rail voltage is supplied by a battery. In this case only the FCLKN control signal will be generated. It is also assumed that the charge pump 28 in a simulation of this example is internally regulated to −2.7V. This means that the charge pump will not deviate in the negative direction from −2.7V but it would droop in the positive direction, if the clock frequency is not high enough, such that the maximum available current that the charge pump 28 could sink would be less than the current flowing into it from the amplifier's $V_{NEG}$ terminal. To further simplify this example, it is assumed that the speaker 12 can be modeled by a resistor. In this example, which corresponds to the simulated waveforms in subsequently described FIGS. 2-6, the selected value of $f_{FCLKN}$ for a particular sample [n] might be one of a number of frequencies including 640, 320, 160, 80, and 40 kHz.

It should be noted that in audio system 1-2 of FIG. 1B, the frequency $f_{FCLKN}$ of FCLKN controls the maximum available current that can flow into negative charge pump 28 from amplifiers 10R and 10L.

Figure 1C:
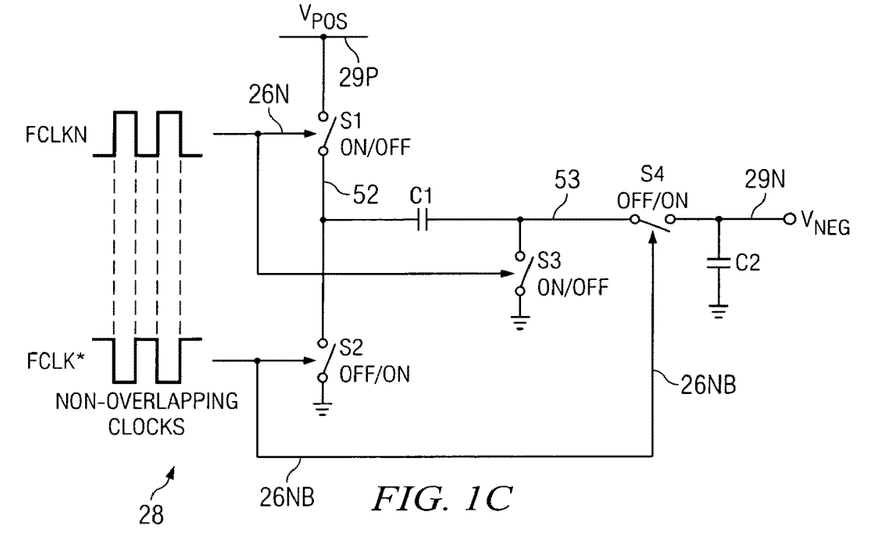
FIG. 1C is a simplified diagram of a charge pump which can be included in block 28 of FIG. 1A.

FIG. 1C shows a basic schematic diagram of a negative charge pump 28, which includes a switch S1 having one terminal connected to $V_{POS}$ conductor 29P and another terminal connected by conductor 52 to one plate of a "flying" capacitor C1 and to one terminal of a switch S2. A second terminal of switch S2 is connected to ground. The control electrode of switch S1 is coupled to FCLKN by means of conductor 26N, and the control electrode of switch S2 is coupled by means of a conductor 26NB to a signal FCLKN* which is a non-overlapping version of the logical complement of FCLKN. The other terminal of flying capacitor C1 is connected by conductor 53 to one terminal of switch S3 and to one terminal of switch S4. The other terminal of switch S3 is connected to ground, and the other terminal of switch S4 is connected by $V_{NEG}$ conductor 29N to one terminal of holding capacitor C2, the other terminal of which is connected to ground. The control terminal of switch S3 is connected to FCLKN and the control terminal of switch S4 is connected to FCLKN*. During a phase 1, switches S1 and S3 are closed, and the flying capacitor C1 is charged to $V_{POS}$ volts with node 52 being $V_{POS}$ volts and node 53 being at ground. During a non-overlapping phase 2, both switches S1 and S3 are open and switches S2 and S4 are closed. With node 52 now connected to ground, node 53 goes to $-V_{POS}$ and the negative charge from the flying capacitor C1 is transferred to holding capacitor C2. Eventually holding capacitor C2 charges up to $-V_{POS}$. This implementation of negative charge pump 28 may further include a local feedback loop which controls the amount of charge transferred per cycle of FCLKN, wherein $V_{NEG}$ is fed back to allow only partial charge transfer from flying capacitor C1 to holding capacitor C2 when necessary to keep the output at the target value of $V_{NEG}$, for example, −2.7 volts.

As a practical matter, having digital input data already stored in digital storage medium 2 (FIG. 1B) makes it convenient to feed the stored information forward to adjust the clock frequency of the power converter and the amplifier's supply bias voltages $V_{NEG}$ and $V_{POS}$ to enable amplifiers 10R,L to supply the required output signals $Vout_R$ and $Vout_L$ without distortion. Digital signal processing system 13 and power controller 27 can provide a high magnitude, adjustable bias voltage $V_{NEG}$ and $V_{POS}$ to amplifiers 10R,L and maintain a particular value of $V_{NEG}-V_{POS}$ only as long as is necessary to ensure that high values of amplitude amplifier input signals $Vin_R$ and $Vin_L$ have been amplified without distortion. Then the amplifier and DC-DC converter power consumption can adjusted in accordance with the next imminent values of $Vin_R$ and $Vin_L$ to arrive at the inputs of amplifiers 10R and 10L. Other things can be conveniently done in response to the stored digital incoming data to make good decisions when to bias the amplifier voltage up and/or down. For example, if a zero input signal is detected, amplifiers 10R and 10L power converter 27 can be disabled completely.

Figure 2:
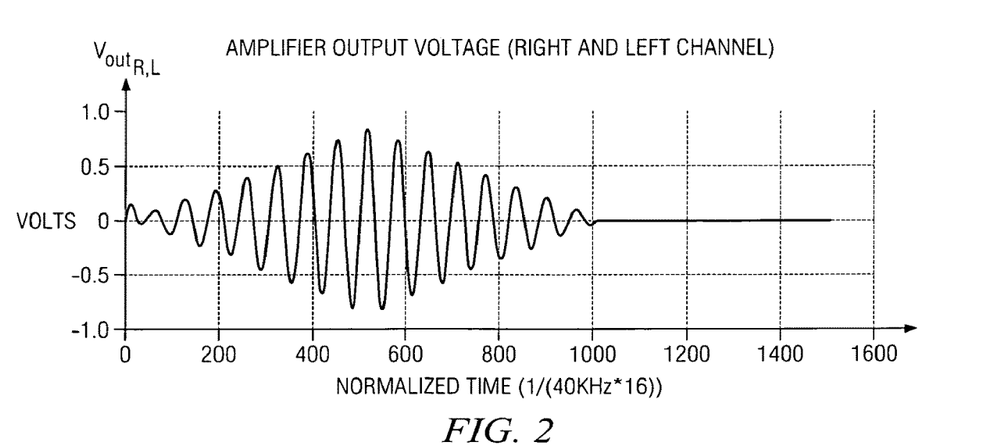
FIG. 2 is a simulated plot of an amplified output signal produced by either of the amplifiers in block 10 of FIG. 1A.

FIG. 2 shows a simulation of the output voltage $Vout_{R,L}$ being provided by each of amplifiers 10R and 10L. This simulated output voltage was derived from a delta-sigma data sample and by a simulation of the operation of digital-to-analog conversion circuit 4 in FIG. 1B. The simulation, which was performed by means of a commercially available MAT- LAB simulation program, assumes the charge pump flying capacitor C1 and holding capacitor C2 of FIG. 1C have values of 1 uF and 2.2 uF, respectively. $V_{SUPPLY}$ of negative charge pump 28 is set to 3.3V, and the maximum frequency of the charge pump clock signal FCLKN is 640 KHz. In the simulation, two identical delta-sigma data steams $IN_R$ and $IN_L$ are processed in parallel by the right and left channel delta-sigma DACs 4R and 4L and analog filters 6R and 6L, and by digital signal processing system 13. The amplitude of the simulated output voltages $Vout_{R,L}$ ramps up from a relatively low level to a peak level and then back down to the relatively low level. The dissipated power is proportional to $(Vout_{R,L})^2$, and the peak power is dissipated when the amplitude of the envelope of $Vout_{R,L}$ in FIG. 2 is highest, and lowest wherein the amplitude of $Vout_{R,L}$ is lowest.

Figure 3:
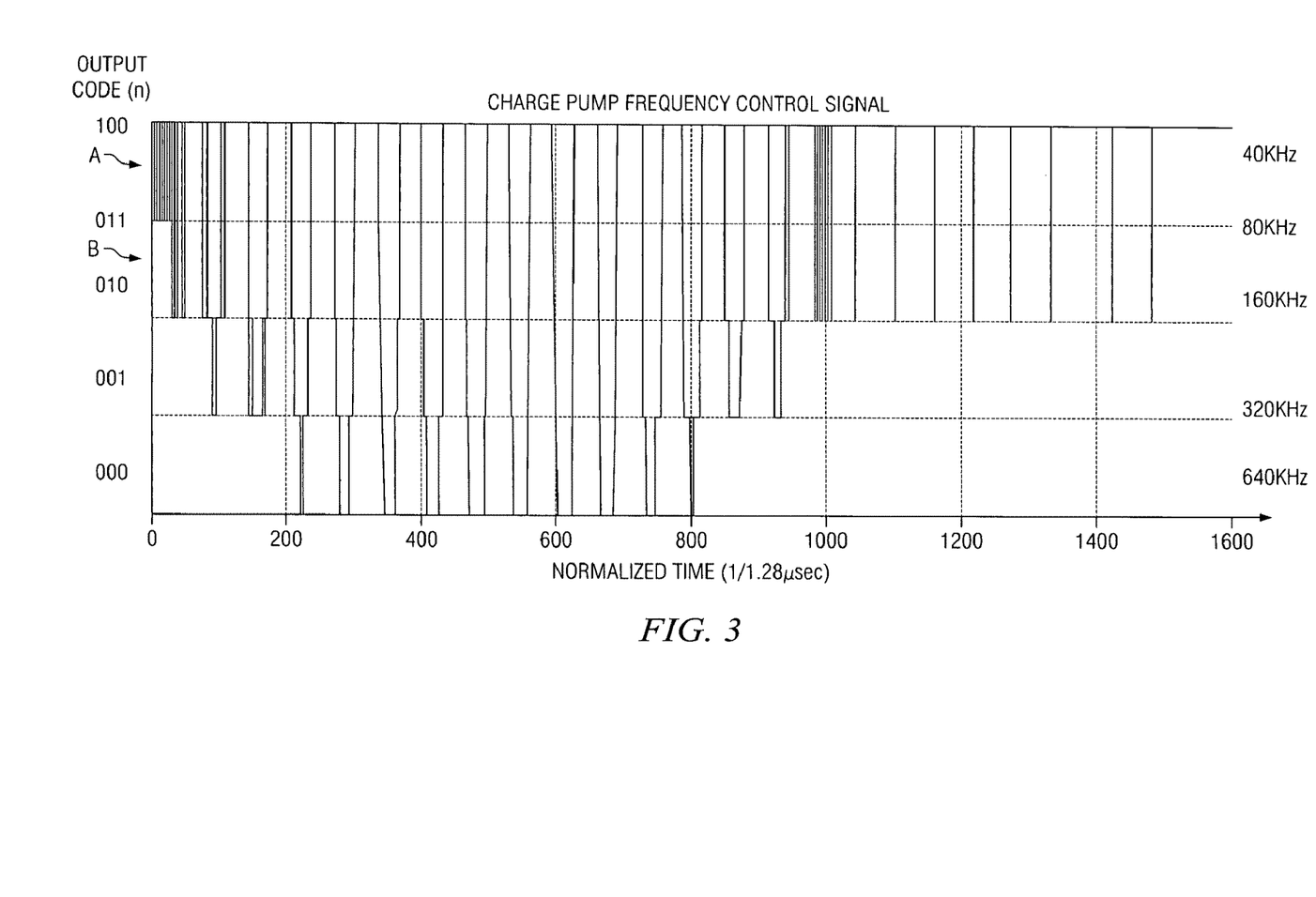
FIG. 3 is a simulated plot which illustrates quantization of charge pump switching frequency $f_{FCLKN}$ as a function of amplifier output signal amplitude as shown in FIG. 2.
Figure 8:
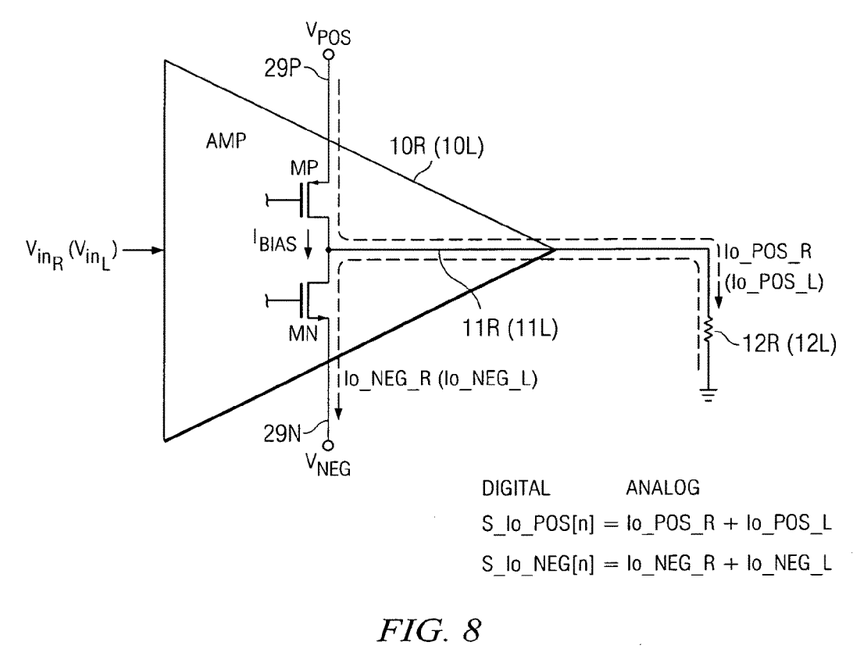
FIG. 8 is simplified diagram of block 10R or 10L showing the flow of output currents Io_POS_R, Io_POS_L, Io_NEG_R, and Io_NEG_L, with respect to load 12R or 12L and terminals $V_{POS}$, $V_{NEG}$, and ground.

FIG. 3 shows simulated values of the frequency of FCLKN in FIG. 1B for various output codes produced by FCLK_NEG mapping table 46 (FIG. 1B) to indicate the present peak currents that will flow into the negative charge pump 28. The frequency $f_{FCLKN}$ adapts to variations in the load current. Digital current values S_Io_NEG[n] correspond to imminent time-varying analog amplifier output currents Io_NEG_R+ Io_NEG_L which are about to flow out of $V_{POS}$ and into $V_{NEG}$ via the ground terminal in FIG. 8, respectively. The digital current values S_Io_NEG[n] computed by digital signal processing system 13 then are used to generate the signal FCLK_NEG[N] used as the input to digitally controlled oscillator 24N to control the frequency $f_{FCLKN}$ of charge pump clock FCLKN. Thus, the frequency of charge pump clock FCLKN is adapted in advance to the load requirements corresponding to the imminent digital audio data signals $IN_R$ and $IN_L$. In the example of FIG. 3, it can be seen that charge pump 28 switches initially at 40 kHz for the lowest amplitudes of the amplifier output, as shown in dark area A of FIG. 2. As the load current of $Vout_{R,L}$ increases, the digital signal processing indicated in FIG. 7 executed in block 40 of digital signal processing system 13 accordingly increases the frequency of FCLKN to 80 kHz, as indicated by "B" and so forth to follow the peaks and valleys of the relatively slowly changing envelope of $Vout_{R, L}$.

Figure 4:
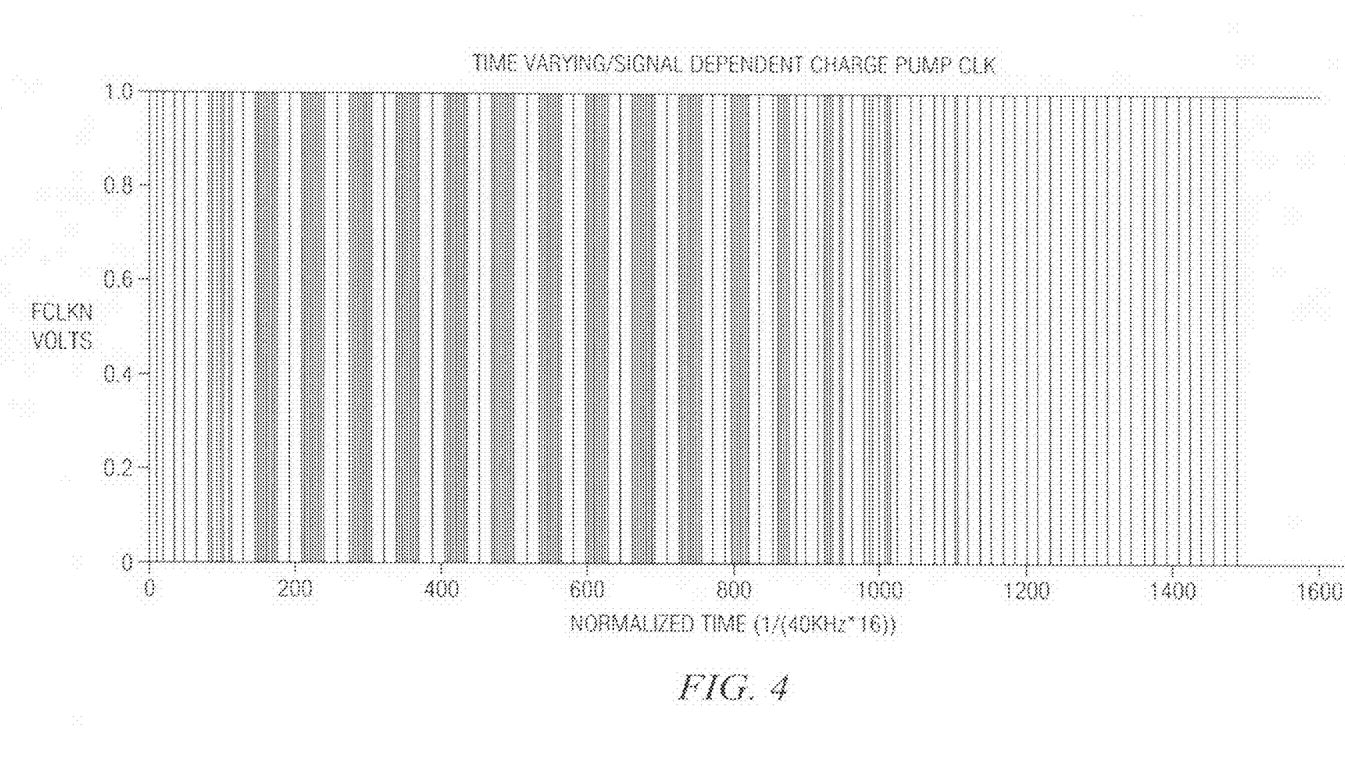
FIG. 4 is a simulated plot which illustrates how the charge pump clock signal FCLKN corresponds to the amplifier output voltage shown in FIG. 2.

FIG. 4 shows a simulated waveform of charge pump clock FCLKN corresponding to the waveforms shown in FIG. 2, which can be the waveform of either or both of $Vout_R$ and $Vout_L$.

Figure 5:
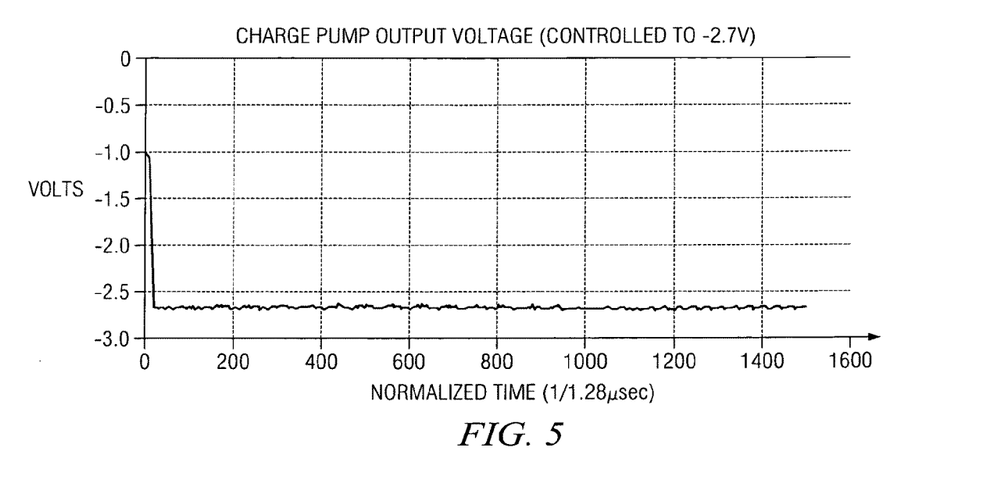
FIG. 5 is a simulated plot that shows the charge pump output voltage $V_{NEG}$ corresponding to the amplifier output signal shown in FIG. 2.

FIG. 5 shows the simulated charge pump transient output voltage $V_{NEG}$, regulated to −2.7V. Note that once the proper switching frequency has been reached, the output achieves a steady −2.7 V value of $V_{NEG}$. This shows that $V_{NEG}$ is quite stable, with very little dependence on the amplitudes of the amplifier input signals $Vin_R$ and $Vin_L$.

Figure 6:
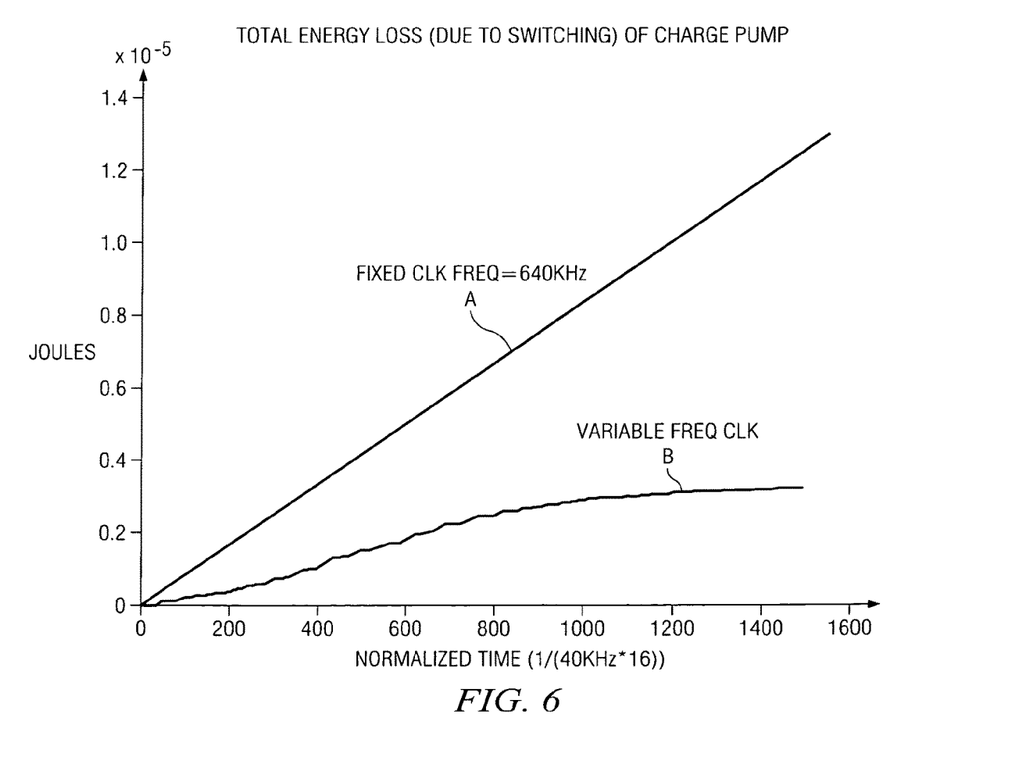
FIG. 6 is a simulated plot which shows the difference between the total loss of energy in charge pump 28 of FIG. 1B.

In FIG. 6, a MATLAB simulation shows the total energy loss due to charge pump switching that occurs when the input signal shown in FIG. 1B is applied. Curve "A" of the simulation is for the case wherein a fixed charge pump clock frequency FCLKN of 640 kHz is applied to charge pump 28. Curve "B" of the simulation is for the case wherein the frequency of FCLKN is varied according to the digital peak amplitudes of the incoming $IN_R$ and $IN_L$ detected by digital signal processing system 13 in advance of $Vin_R$ and $Vin_L$ arriving at the inputs of amplifiers 10R and 10L, respectively.

It should be appreciated that the digital feed-forward technique of the present invention avoids the need to use a closed loop analog feedback system in analog circuitry which processes the analog input signal, and therefore also avoids the substantial additional power dissipation, integrated circuit chip area, and complex circuitry required by prior art analog amplifier feedback systems that attempt to adjust power dissipation to match analog output signal amplitude. Furthermore, the above described embodiments of the invention facilitate optimization of circuit performance and power consumption by allowing them to be programmed through a standard digital interface.

An advantage of the above described embodiments of the invention is that it increases the time-averaged power efficiency of a power converter compared to other techniques that are based on energy loss per cycle. The described embodiments of the invention are relatively simple to implement using digital circuits to provide easy programmability for the purpose of optimizing power consumption with respect to the amplitude of imminent incoming digital audio information. The optimized charge pump frequency always leads, rather than lags, the power demands of the load driven by the amplifier 10, thereby preventing or substantially reducing voltage ripple and voltage droop of $Vout_R$ and $Vout_L$. The adjusted value of $V_{NEG}$ therefore always is at an approximately optimum level, so there is never a condition with a lag between the time at which $Vin_R$ and $Vin_L$ are amplified and the time at which $V_{POS}-V_{NEG}$ is adjusted to provide adequate power from amplifiers 10. This avoids signal distortion that otherwise would occur in amplifier(s) 10.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the signals referred to in the claims can be, but do not need to be, audio signals.

What is claimed is:

1. Circuitry for reducing power in a digital amplifying system, comprising:
 a first digital delay circuit for receiving and delaying a first incoming digital data signal which represents a first analog input signal;
 a first digital-to-analog conversion circuit for receiving the delayed first digital data signal from the first digital delay circuit and converting the delayed first data to a first analog signal;
 a first amplifier for amplifying the first analog signal to produce a first output voltage applied to a first load;
 a digital signal processing system for receiving the first incoming data signal, detecting first signal amplitude information contained in the first incoming digital data, and converting the first signal amplitude information to a first digital control signal to optimize power efficiency of the digital amplifying system; and
 power conversion circuitry for converting the first digital control signal to an adjustable maximum available supply current in a first supply conductor of the first amplifier circuitry of at least sufficient magnitude to avoid distortion during the amplifying of the first analog signal to produce the first output voltage, wherein the power conversion circuitry includes a charge pump for producing the adjustable maximum available supply current so as to maintain a first supply voltage on the first supply conductor, switching of the charge pump being controlled by a first clock signal.

2. The circuitry of claim 1 wherein the digital signal processing system performs a first mapping function to map the first digital control signal to a first code for selecting a first predetermined frequency of the first clock signal to optimize power consumption of the charge pump.

3. The circuitry of claim 2 including a first digitally controllable oscillator circuit for producing the first clock signal in response to the first code.

4. The circuitry of claim 3 including a programmable DC-DC converter for producing an adjustable second supply voltage which is applied by means of a second supply voltage conductor to a high-side supply terminal of the first amplifier, low-side supply terminals of the charge pump and the DC-DC converter being coupled to a first reference voltage, switching of the DC-DC converter being controlled by a second clock signal.

5. The circuitry of claim 4 wherein the digital processing system converts the first signal amplitude information to a second digital control signal and performs a second mapping function to map the second digital control signal to a second code for selecting a predetermined value of the second supply voltage, the charge pump generating the first bias voltage in response to the second supply voltage.

6. The circuitry of claim 5 wherein the digital processing system converts the first signal amplitude information to a third digital control signal for optimizing power consumption of the DC-DC converter.

7. The circuitry of claim 6 wherein the digital signal processing system performs a third mapping function to map the third digital control signal to a third code for selecting a second predetermined frequency of the second clock signal to optimize power consumption of the DC-DC converter.

8. The circuitry of claim 7 including a second digitally controllable oscillator circuit for producing the second clock signal in response to the third code.

9. The circuitry of claim 1 wherein the first digital delay circuit delays the first incoming digital signal at least enough to ensure that the first analog signal does not arrive at an input of the first amplifier until any voltage droop or voltage ringing of the first supply voltage due to adjustment of the adjustable maximum available supply current in response to the first digital control signal has settled.

10. The circuitry of claim 1 wherein the first incoming digital data signal is initially stored in and then received from a digital storage medium by the first digital-to-analog conversion circuit.

11. The circuitry of claim 1 wherein the digital signal processing system includes a first finite impulse response (FIR) filter that performs a detecting of the first signal amplitude information by receiving and filtering the first incoming digital data.

12. The circuitry of claim 1 wherein the digital signal processing system multiplies each of a plurality of samples of the first signal amplitude information by a digital representation of a gain of the first amplifier and by a digital representation of a load impedance of the first load for each sample of the first signal amplitude information.

13. The circuitry of claim 7 wherein the first digital delay circuit, the first digital-to-analog conversion circuit, the first amplifier, the first load, and the first finite impulse response filter are included in a first signal channel, the circuitry including a second signal channel including a second digital delay circuit which receives and delays a second incoming digital data signal that represents a second analog input signal, a second digital-to-analog conversion circuit for producing a second analog signal, a second amplifier having a low-side supply terminal connected to the first supply conductor for amplifying the second analog signal to produce a second output voltage applied to a second load, and a second finite impulse response filter, all of which are substantially similar to those in the first signal channel, the digital signal processing system receiving the second incoming data signal, detecting second signal amplitude information contained in the second incoming digital data, and combining the second signal amplitude information with the first signal amplitude information to generate the first digital control signal, and the first supply conductor being connected to the low-side supply terminal of the second amplifier, the power conversion circuitry converting the first digital control signal to the adjustable maximum available supply current in the low-side supply terminals of the first and second amplifiers of at least sufficient magnitude to avoid distortion during the amplifying of the first and second analog signals to produce the first and second output voltages.

14. A method for reducing power dissipated in a digital amplifying system, comprising:
delaying an incoming digital data signal;
converting the delayed digital data signal to an analog signal to be amplified by an amplifier to produce an output signal;
during the delaying, detecting signal amplitude information contained in the incoming digital data;
converting the signal amplitude information to a first digital control signal; and
producing an adjustable maximum available supply current of the amplifier in response to the first digital control signal such that the adjustable maximum available supply current of the amplifier has at least sufficient magnitude to avoid causing signal distortion during amplifying of the analog signal by means of the amplifier to produce the output signal by controlling a first clock signal that controls a switching frequency of a charge pump so as to maintain a predetermined value of a first supply voltage on a first supply conductor of the amplifier during time-varying load currents.

15. The method of claim 14 including setting the predetermined value of the first supply voltage in response to a second supply voltage applied to a high-side supply voltage conductor of the amplifier produced by a programmable DC-DC converter, by converting the signal amplitude information to a second digital control signal, controlling the programmable DC-DC converter in response to the second digital control signal to produce a predetermined value of the second supply voltage, and generating the first supply voltage in response to the second supply voltage by means of the charge pump.

16. The method of claim 15 including converting the signal amplitude information to a third digital control signal and controlling a second clock signal that controls a switching frequency of the programmable DC-DC converter in response to the third digital control signal so as to optimize power dissipation in the programmable DC-DC amplifier.

17. The method of claim 14 including multiplying of each of a plurality of samples of the signal amplitude information by a digital representation of a gain of the amplifier and by a digital representation of a load impedance of the load for each sample of the signal amplitude information to produce each of the first and third digital control signals.

18. An apparatus comprising:
a digital signal processing system that receives a digital input signal and a gain signal;
a delay circuit that receive the digital input signal;
a digital-to-analog conversion circuit that is coupled to the delay circuit;
a power converter having:
a DC-DC converter that is coupled to the digital signal processing system and that generates a first voltage; and a charge pump that is coupled to the digital signal processing system and the DC-DC converter and that generates a second voltage;

an amplifier having an input terminal, a high-side power terminal, and a low-side power terminal, wherein the input terminal of the amplifier is coupled to the delay circuit, and wherein the high-side power terminal is coupled to the DC-DC converter so as to receive the first voltage, and wherein the low-side power terminal is coupled to the charge pump so as to receive the second voltage.

19. The apparatus of claim 18, wherein the DC-DC converter further comprises:

a buck converter that receives an amplitude adjust signal from the digital signal processing system;

a first oscillator that receives a first control signal from the digital signal processing system to generate a first clock signal and that is coupled to the buck converter so as to provide the first clock signal to the buck converter; and a second oscillator that receives a second control signal from the digital signal processing system to generate a second clock signal and that is coupled to the charge pump so as to provide the second clock signal to the charge pump.

20. The apparatus of claim 19, wherein the digital-to-analog conversion circuit further comprises:

a sigma-delta digital-to-analog converter (DAC) that receives the digital input signal; and a low pass filter that is coupled between the sigma-delta DAC and the input terminal of the amplifier.

21. The apparatus of claim 20, wherein the charge pump further comprises:

a switching node;

a first switch that is coupled to the buck converter so as to receive the first voltage and that is coupled to the switching node, wherein the first switch is controlled by the second clock signal;

a second switch that is coupled to switching node, wherein the second switch is controlled by an inverse of the second clock signal;

a first capacitor that is coupled to the switching node;

a third switch that is coupled to the first capacitor, wherein the third switch is controlled by the second clock signal; and a second capacitor that is coupled between the third switch and the low-side power terminal.

* * * * *